United States Patent
Kwon et al.

[19]

[11] Patent Number: 6,033,948
[45] Date of Patent: Mar. 7, 2000

[54] METHOD OF MAKING HIGH VOLTAGE METAL OXIDE SILICON FIELD EFFECT TRANSISTOR

[75] Inventors: O-Kyong Kwon, Seoul; Hoon-Ho Jeong, Busan, both of Rep. of Korea

[73] Assignee: LG Semicon Co., Ltd., Cheongju, Rep. of Korea

[21] Appl. No.: 09/178,516

[22] Filed: Oct. 26, 1998

Related U.S. Application Data

[62] Division of application No. 08/756,433, Nov. 26, 1996, Pat. No. 5,831,320.

[30]     Foreign Application Priority Data

Dec. 2, 1995 [KR] Rep. of Korea ..................... 95/46199

[51] Int. Cl.[7] .............................................. H01L 21/8238
[52] U.S. Cl. .......................................... 438/217; 438/289
[58] Field of Search .................................... 438/217, 231, 438/232, 288, 289, 290, 291, 305, 306, 307

[56]              References Cited

U.S. PATENT DOCUMENTS

| 5,108,940 | 4/1992 | Williams | 438/288 |
| 5,306,652 | 4/1994 | Kwon et al. | 438/291 |
| 5,306,656 | 4/1994 | Williams et al. | 438/306 |
| 5,688,722 | 11/1997 | Harrington, III | 438/217 |

OTHER PUBLICATIONS

Kwon, O–K, et al., "Optimized 60–V Lateral DMOS Devices for VLSI Power Applications," 1991 Symposium on VLSI Technology, Oiso, Japan, pp. 115–116.

*Primary Examiner*—Chandra Chaudhari
*Attorney, Agent, or Firm*—Fleshner & Kim

[57]              ABSTRACT

A manufacturing method of high voltage MOSFET includes a process forming the first and second conductive wells in a semiconductor substrate; process forming drift areas in the first and second conductive wells; process growing an isolation membrane on the substrate surface between the first and second conductive wells; process forming a gate insulation film; process forming a gate on the gate insulation film above the first and second conductive wells; process forming low concentration n-and p-type dopant areas in the drift areas of the parts adjacent to the gate; process forming buried diffusion areas in the first and second conductive wells; process forming source/drain having a body contact on a side on the buried diffusion areas in the first and second conductive wells; process forming an insulation film having a contact formed in such way that is exposed the surface of source/drain on the entire surface of the substrate including the gate and isolation membrane; process forming a metal film on the insulation film; and process forming source/drain electrodes and the metal field plates, by etching the metal film using a mask.

30 Claims, 16 Drawing Sheets

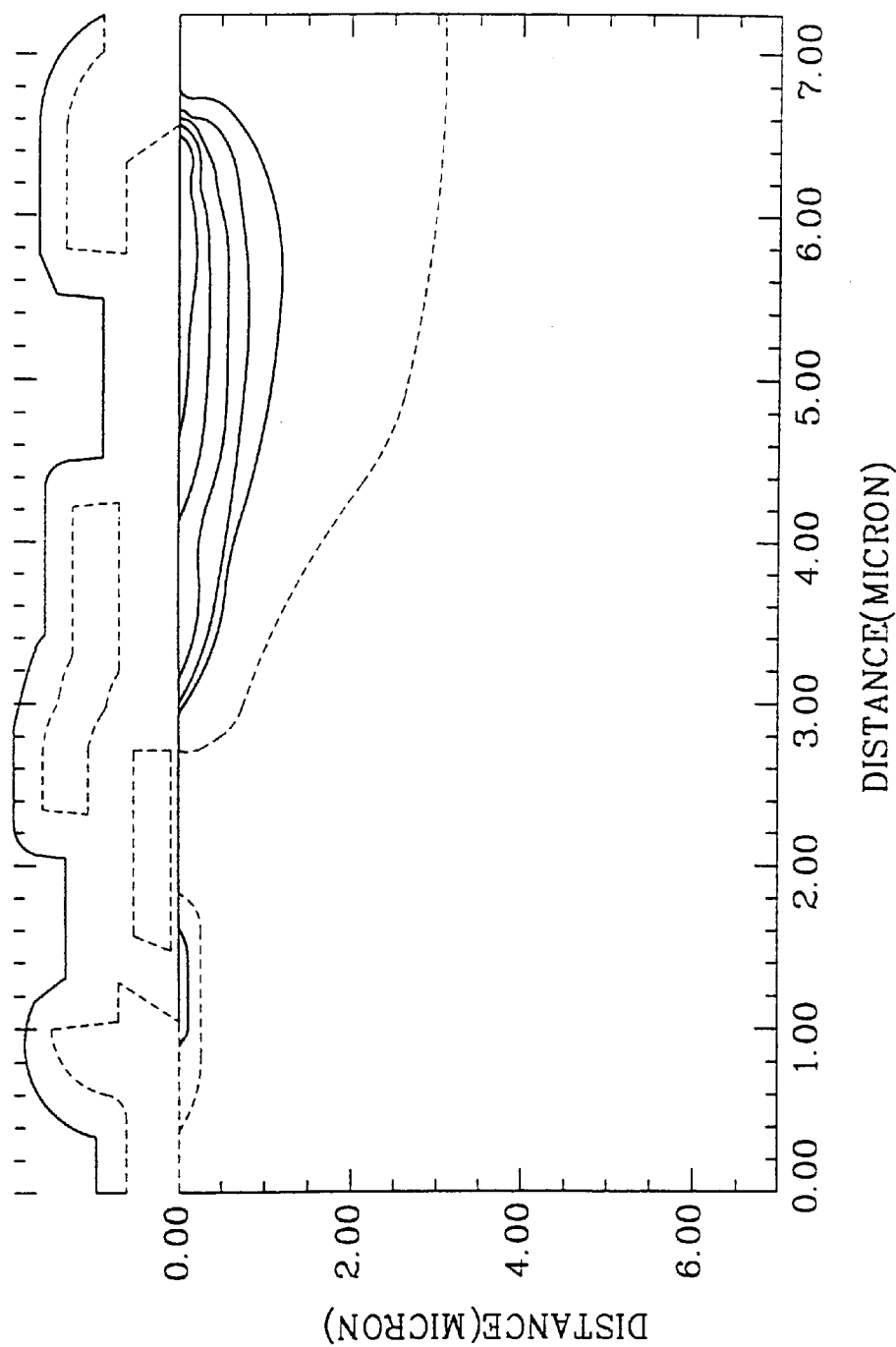

METHOD OF MAKING HIGH VOLTAGE METAL OXIDE SILICON FIELD EFFECT TRANSISTOR

This application is a Divisional of application Ser. No. 08/756,433, now U.S. Pat. No. 5,831,320, filed Nov. 26, 1996.

BACKGROUND OF THE INVENTION

1. Field of the Invention

The present invention relates to a structure and manufacturing method of a power metal oxide silicon field effect transistor (hereinafter referred to as "MOSFET"), and particularly to a structure and manufacturing method of a high voltage MOSFET which obtains, a high breakdown voltage with an area small enough to fit for the use of smart power IC, and provided with a metal field plate to reduce any specific-on-resistance.

2. Description of the Prior Art

Since the power MOSFET has an excellent switching speed compared with other power elements, and a characteristic that it has low on-resistance at any element of relative low resisting pressure less than 300(V), the high voltage lateral power MOSFET gets into the spotlight as power element for the very large-scale integrated circuit.

As power elements in general use, there are double-diffused MOSFET (DMOSFET), insulated gate bipolar transistor (IGBT), bipolar transistor, etc., but as complementary metal oxide semiconductor (CMOS) VLSI for low voltage, and elements for high voltage (10V to 500V), the lateral double-diffused MOSFET (hereinafter referred to as "LDMOSFET") is developed as most effective element.

In FIG. 1(A) there is shown a sectional structure of a general LDMOSFET used widely for smart power IC. The manufacturing process of the said LDMOSFET is described briefly as follows:

In the first place, a drift area (11) to prevent any high voltage is made on a silicon substrate (13) by the epitaxial layer growth method or well forming process using diffusion, and a field oxide (4) is formed on the surface of substrate between the channel (8) and the drain (10) using the process of the local oxidation of silicon.

In the next step, an oxide film is grown as gate-insulating film on the entire surface of the substrate including the said field oxide(4), and then n+ polycrystalline silicon film is formed by implementing POCl3 diffusion after depositing the polycrystalline silicon film on the said oxide film.

In the next step, a polycrystalline silicon gate (1) is formed by selecting and etching the said N+ polycrystalline silicon film using a photosensitive mask, and after self-align to the polycrystalline silicon gate on the side of source, and ion-injection of p-dopants, the drive-in is performed. As a result, a double-diffused well (or p-well) is formed.

In the continuous step, a source(6) and a drain(10) are formed by an ion-injection of n-dopants in the specified parts of the right and left sides of the said polycrystalline silicon gate(1), and p+ area, a body contact (5) is formed at a location adjacent to the said source(6), by implementing the ion-injection of p-dopants after forming a photosensitive mask on the said source(6).

Subsequently, an oxide film and an insulation film are deposited to the substrate including the said polycrystalline silicon gate(1), and the surface of such oxide film is evened by reflowing it at the temperature of 900 C. to 1000 C., and the ion-injected dopants are activated simultaneously.

Then, a contact hole is formed by etching the oxide film with a mask for forming the contact, to the extent that the specified part of the said source(6) and the specified parts of the body contact(5) and drain are exposed, and after depositing a metal film over the entire surface of oxide film including the said contact hole, a metal lead, for example, a source electrode(2) and a drain electrode(3) are formed by selecting and etching it, respectively.

Finally, the manufacture of elements are completed by depositing an insulation film, for example an oxide film as a passivation layer to protect the element, over the entire surface of the oxide film including the said source and drain electrodes 2, 3), and opening then the pad.

Accordingly, in case of n-channel high voltage LDMOSFET, an inversion layer is formed in the channel area(8) when a voltage higher than the threshold voltage is applied, and if a voltage higher than that of the source electrode(2) terminal is applied at that time to the drain electrode(3) terminal, the electrons are supplied from source (6) to channel(8), through the surface drift area(9) in the lower part of the field oxide(4), to the drain(10), and which makes the current flow.

Although the said elements may be employed in diversified ways in high side driver (HSD), low side driver (LSD) and H-bridge circuits within chips, and it is easily manufactured, there are disadvantages that the subthreshold slope is so large due to ununiformity of the doping concentration in the channel area which is the structure of LDMOSFET itself, that the threshold voltage is risen, and that a breakdown phenomenon occurs on the silicon substrate surface in drift area near the channel.

In FIG. 1(B) is shown a structure of a reduced surface field (RESURF) LDMOSFET in which the performance of LDMOSFET as described in FIG. 1(A) is improved.

In comparison with drift area made by the LDMOSFET as described in FIG. 1(A) on substrate using the epitaxial growth method or well formation process, so as to include all the parts in which source, drain and field oxide(4) are formed, in the said element, the drift area is formed so as to have the minimum area, by implementing ion-injection and drive-in or epitaxial layer formation in parts in which field oxide(4) and drain(10) are formed, in a manner that such parts are adjacent to the said D-well(7), as shown in FIG. 1(B) to use the RESURF principles.

To form the elements by the said way is to improve the breakdown phenomenon and conduction resistance on the silicon substrate surface which are disadvantages of the LDMOSFET as shown in FIG. 1(A), and has advantages that it may obtain high breakdown voltage and low conduction resistance with the minimum area, by forming the drift layer as well-type or epitaxial layer.

However, such an element has disadvantages in that it may be used only as LSD, for p-type substrate(12) is connected to the source and the body contact(5), and it being of the DMOS structure, it is inevitable to have a high threshold voltage due to ununiformal doping concentration of the channel.

In FIG. 1(C) is shown the RESURF extended drain MOSFET (EDMOSFET) for improving the threshold voltage characteristics of such LDMOSFET and eliminating the restriction on the scope of application which is a shortcoming of the RESURF LDMOSFET.

The said element has no D-well (or p-well) as shown in FIGS. 1(A) and 1(B).

Since the doping concentration in the channel area is uniform, the threshold voltage may be r educed, and for the purpose of obtaining any desires threshold voltage, it is possible to adjust the threshold voltage to a desired one by carrying out a threshold voltage adjustment ion-injection into the channel area(8), as in the low voltage MOSFET.

In case of n-channel high voltage RESURF EDMOSFET, therefore, the most high voltage applied to the drain electrode(3) terminal is applied to the drift area(11), and some voltage is applied to the channel area(8). In this case, when a voltage higher than the threshold voltage is applied to a polycrystalline silicon gate(1), an inversion layer is formed in the channel area(8), and when a voltage lower than that of the drain electrode(3) terminal is applied to the source electrode(2) terminal, electrons flow from the source (6) through the channel area(8) and drift area(11) to the drain(10).

As reported by O. K. Kwon et al., "Optimized 60 V Lateral DMOS Device for VLSI Power Applications," 1991 Symposium on VLSI Technology, Oiso, Japan, pp.115–116, however, the above-mentioned element has also disadvantages in that since the electrons having passed through the channel area(8) flow below the field oxide transiting the surface drift area(9), and the current conduction path is distorted, a high conduction resistance is inevitable.

SUMMARY OF THE INVENTION

Therefore, an object of the present invention is to provide a structure and manufacturing method of a high voltage MOSFET designed to embody a high breakdown voltage and low conduction resistance in the minimum area, by forming a metal field plate in the course of a metal electrode formation process.

The first structure of high voltage MOSFET according to the present invention to achieve the above-mentioned object includes a semiconductor substrate; first and second conductive wells formed in the said substrate; isolation membrane formed on substrate between the said first and second conductive wells; gates formed on surfaces of the substrates on which the said first and second conductive wells are formed, respectively; drift areas formed within the said first and second conductive wells, respectively, so as to be connected to lower part of one edge of the said gate; drains formed in the said drift areas, respectively; source having a depressed diffusion area formed in the said first and second conductive wells, respectively, so as to be connected to the lower part of the other edge of the said gate; body contacts formed in the said first and second conductive wells, respectively, and formed on a side of the said source having a depressed diffusion area; first insulation film formed on substrate including the said gate and isolation membrane, and having a contact hole formed so that surfaces of the source and drain are exposed; source/drain electrodes formed in specified parts of the first insulation film including the said contact hole, respectively; field plates located in the said drift area and on the first insulation film on the gate, respectively, and formed between the said source/drain electrodes so as to be separated from them; and second insulation film formed on the first insulation film including the said source/drain electrodes and the field plates.

The second structure of the high voltage MOSFET according to the present invention to achieve the said object includes semiconductor substrate; first and second conductive wells formed in the said substrate; isolation membrane formed on the substrate between the said first and second conductive wells; gates formed on surfaces of substrates on which the said first and second conductive wells are formed, respectively; first and second drift areas formed in the said first conductive well so as to be connected to lower parts of both edges of the said gates, respectively, in a form separated from each other at a specified distance; first and second drift areas formed in the said second conductive well so as to be connected to lower parts of both edges of the said gates, respectively, in a form separated from each other at a specified distance; source/drain formed in the first and second drift areas formed in the first and second conductive wells, respectively; body contacts formed in the said first and second conductive wells, and formed on each side with am isolation membrane between the first and second drift areas, respectively; first insulation film formed on substrate including the said gates and insulation film, and having a contact hole formed so that surfaces of source/drain and body contact are exposed; source/drain electrodes formed in specified parts of the first insulation film including the said contact hole; first and second field plates located on the first insulation films in and on the said drift areas and gates, respectively, and formed between the said source/drain electrodes so as to be separated from them; and second insulation film formed on the first insulation film including the said source/drain electrodes and the first and second field plates.

The third structure of the high voltage MOSFET according to the present invention to achieve the said object includes semiconductor substrate; first conductive well formed in the said substrate; gate formed on substrate surface on which the said first conductive well is formed; drift area formed in the said first conductive well so as to be connected to lower part of one edge of the said gate; drain formed in the said drift area; source having a depressed diffusion area formed in the said conductive well so as to be connected to lower part of the other edge of the said gate; body contact formed in the said first conductive well, and formed on one side of the said source having a depressed diffusion area; first insulation film formed on substrate including the said gate, and having contact hole formed so that surfaces of the source and drain are exposed; source/drain electrodes formed in specified parts of the first insulation film including the said contact hole; field plates located in and on the said drift area and the first insulation film on the said gate, and formed between them so as to be separated from them; and second insulation film formed on the first insulation film including the said source/drain electrodes and gate.

The fourth structure of the high voltage MOSFET according to the present invention to achieve the said object includes semiconductor substrate; first conductive well formed in the said substrate; gate formed on substrate surface on which the said first conductive well is formed; first and second drift areas formed in the said first conductive well so as to be connected to lower parts of both edges of the said gate, in a form separated from each other at a specified distance; source/drain formed in the first and second drift areas within the said conductive well; body contacts formed in the said first conductive well, and formed on each side with an isolation membrane between the first and second drift areas, respectively; first insulation film formed on substrate including the said gate and isolation membrane, and having a contact hole formed so that surfaces of the source/drain and body contact surfaces are exposed; source/drain electrodes formed in specified parts of the first insulation film including the said contact hole; first and second field plates located in and on the said drift areas and on the first insulation film on gate, and formed between the said source/drain electrodes so as to be separated from them; and second insulation film formed on the first insulation film including the said source/drain electrodes and the said first and second field plates.

Meanwhile, the first manufacturing method of the high voltage MOSFET according to the present invention to achieve the said object, is characterized in that it comprises process forming the first and second conductive wells in a semiconductor substrate; process forming drift areas in the said conductive wells, respectively; process growing an isolation membrane on substrate surface between the said first and second conductive wells; process forming gate insulation film; process forming gates on the gate insulation films on the said first and second conductive wells; process forming low concentration n-and p-type dopant areas in drift areas in parts adjacent to the said gates; process forming depressed diffusion areas in the said first and second conductive wells; process forming source/drain having body contact formed on a side in the depressed diffusion area within the said first and second conductive wells; process forming insulation film having contact formed so that surface of source/drain is exposed on the entire surface of substrate including the said gate and isolation membrane; process forming a metal film on the said insulation film; and process forming source/drain electrodes and metal field plates by etching the said metal film using mask.

The second manufacturing method of the high voltage MOSFET according to the present invention to achieve the said object, is characterized in that it comprises process forming the first and second conductive wells in semiconductor substrate; process forming the first and second p-type drift areas within the said first conductive well; process forming the first and second n-type drift areas within the said second conductive well; process growing an isolation membrane on substrate surface between the said first and second conductive wells; process growing oxide films on both edges of the said first and second p-type drift areas and the said first and second n-type drift areas; process forming a gate insulation film; process forming gates on the gate insulation film between the said first and second n-type drift areas and on the gate insulation film between the said first and second p-type drift areas; process forming the n-and p-type low concentration dopant areas in the first and second p-type drift areas in parts adjacent to the said gates and in the first and second n-type drift areas; process forming source/drain areas in the said first and second p-type drift areas and the said first and second n-type drift areas, and forming simultaneously body contacts on both sides of oxide film; process forming insulation film having a contact formed so that the source/drain areas and the surface of body contact are exposed over the entire surface of substrate including the said gates and isolation membrane; process forming metal film on the said insulation film; and process forming source/drain electrodes and the first and second field plates by etching the said metal film using mask.

The third manufacturing method of the high voltage MOSFET according to the present invention to achieve the said object, is characterized in that it comprises process forming the first conductive well in semiconductor substrate; process forming a drift area in the said first conductive well; process forming a gate insulation film on substrate on which the said drift area is formed, and then forming a gate on it; process forming low concentration n-or p-type dopant area in the drift area in part adjacent to the said gate; process forming a depressed diffusion area in the said first conductive well; process forming source/drain having body contact on a side in the depressed diffusion area within the said first conductive well; process forming insulation film having a contact formed so that source/drain surface is exposed on the entire surface of substrate including the said gate; process forming a metal film on the said insulation film; and process forming source/drain electrodes and metal field plate by etching the said metal film using mask.

The fourth manufacturing method of the high voltage MOSFET according to the present invention to achieve the said object, is characterized in that it comprises process forming the first conductive well in semiconductor substrate; process forming the first and second drift areas in the said first conductive well; process growing oxide films on both edges of the said first and second drift areas; process forming a gate insulation film; process forming a gate on the gate insulation film between the said first and second drift areas; process forming low concentration n-or p-type dopant areas in the first and second drift areas in parts adjacent to the said gate; process forming source/drain areas in the said first and second drift areas, and forming simultaneously body contacts on both sides of the oxide film; process forming insulation film having a contact formed so that source/drain areas and body contact surface are exposed on the entire surface of substrate including the said gate; process forming metal film on the said insulation film; and process forming source/drain electrodes and first and second metal field plates by etching the said metal film using mask.

It is possible as a result of manufacture of elements in the said structure, to maintain the advantages of the existing RESURF EDMOSFET, and to prevent the current conduction path from being distorted by field oxide.

BRIEF DESCRIPTION OF THE DRAWINGS

With reference to the appended drawings, the preferred embodiments of the present invention will hereinafter be described in details.

FIGS. 1(A) to 1(C) show sectional structures of the MOSFET for the smart power IC according to the conventional art, in which FIG. 1(A) is a cross-sectional view showing a structure of the LDMOSFET;

FIG. 1(B) is a cross-sectional view showing a structure of the RESURF LDMOSFET; and FIG. 1(C) is a cross-sectional view showing a structure of the RESURF EDMOSFET;

FIGS. 2(A) and 2(B) show a structure of the RESURF EDMOSFET according to the present invention, in which FIG. 2(A) is a cross-sectional view showing a structure of N-channel RESURF EDMOSFET; and FIG. 2(B) is a cross-sectional view showing a structure of P-channel RESURF EDMOSFET;

FIGS. 4(A) and 4(B) are comparative illustrations on distribution of voltage up to the maximum voltage applied between drain and source, in case where a metal field plate is or is not formed on the RESURF EDMOSFET as described in FIG. 2, in which FIG. 4(A) is a view showing an equivalent potential line of voltage up to the maximum yield voltage, in case where a metal field plate is formed (in case where the yield voltage is 101.5(V), and the voltage applied to the drain is 100(V)); and FIG. 4(B) is a view showing an equivalent potential line of voltage up to the maximum yield voltage, in case where a metal field plate is not formed (in case where the yield voltage is 68(V), and the voltage applied to the drain is 70(V));

FIGS. 5(A) and 5(B) are comparative illustrations on a current conduction path, in case where a metal field plate is or is not formed on the RESURF EDMOSFET as described in FIG. 2, in which FIG. 5(A) is a view showing the current conduction path, when the same voltage as gate is applied to the metal field plate, in case where the metal field plate is formed; and FIG. 5(B) is a view showing the current conduction path, in case where the metal field plate is not formed;

DETAILED DESCRIPTION OF THE INVENTION

In case of an ideal power MOSFET, a perfect RESURF effect (phenomenon that substrate surface field is reduced) should be created to realize the maximum yield voltage in the minimum area, and in case of the conduction resistance, it would draw close to the ideal value, only when no distortion exists in a current conduction path at the time the perfect RESURF effect is created.

However, since the yield voltage and the conduction resistance are to compromised each other upon manufacturing actually the elements, it is very difficult to design them in such manner that the yield voltage becomes maximum, and the low conduction resistance is realized simultaneously.

The present invention proposes in consideration of such matters, a new structure of RESURF EDMOSFET having a high yield voltage in the minimum area, and capable of realizing a low conduction resistance by excluding the current distortion path, with collecting advantages of the existing LDMOSFET, RESURF LDMOSFET, and RESURF EDMOSFET.

This new structure of RESURF EDMOSFET is characterized in that the field plate being formed with a metal, no additional manufacturing process is required, it is adjustable so as to hold a low threshold voltage, and it may be used in diverse application circuits.

Figure 1A:
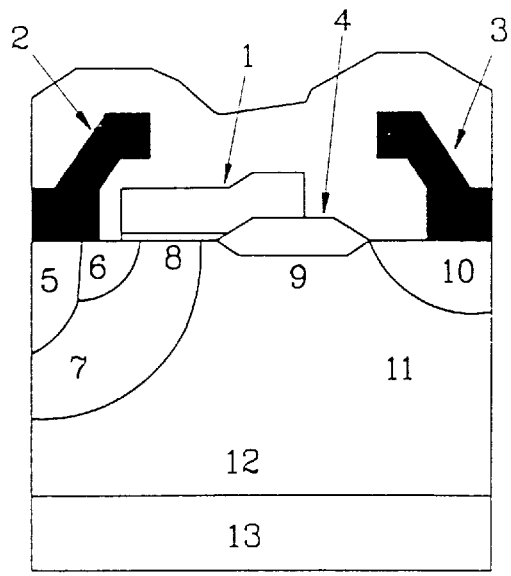
Figure 1B:
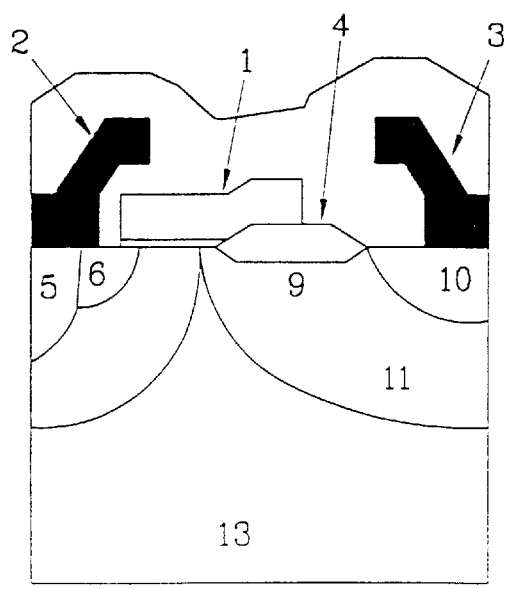
Figure 1C:
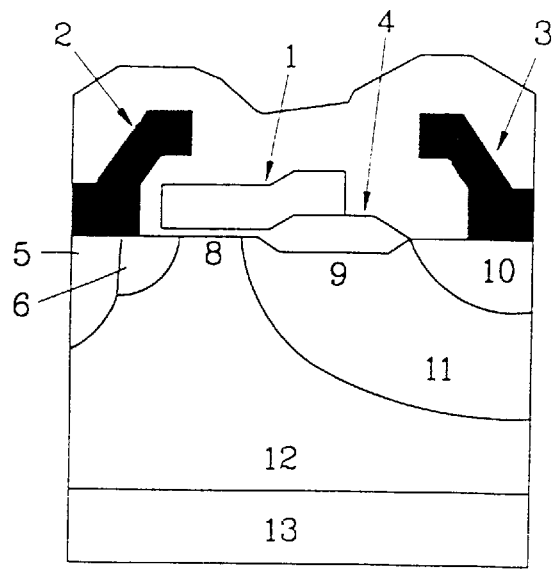
Figure 2A:
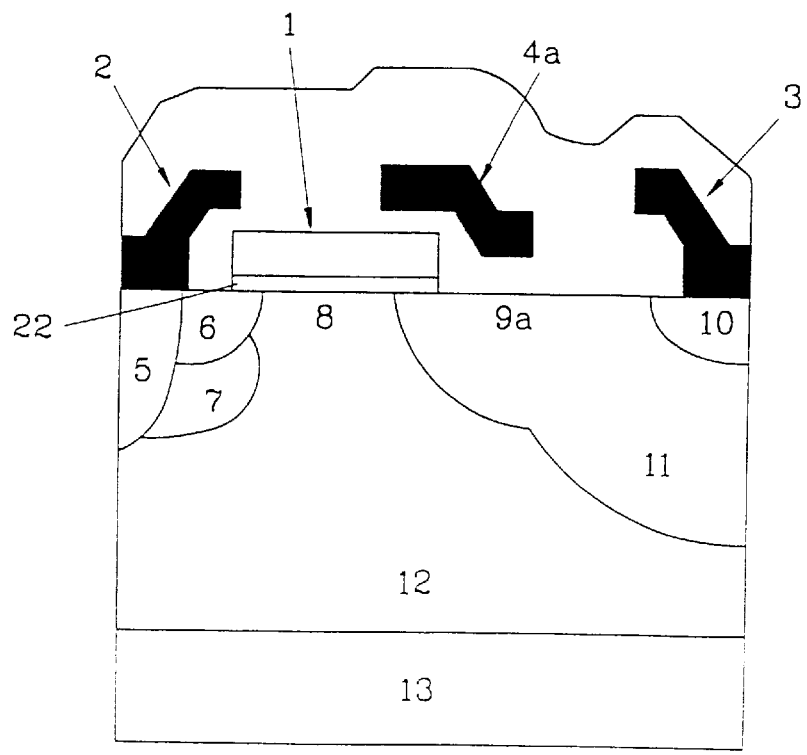
Figure 2B:
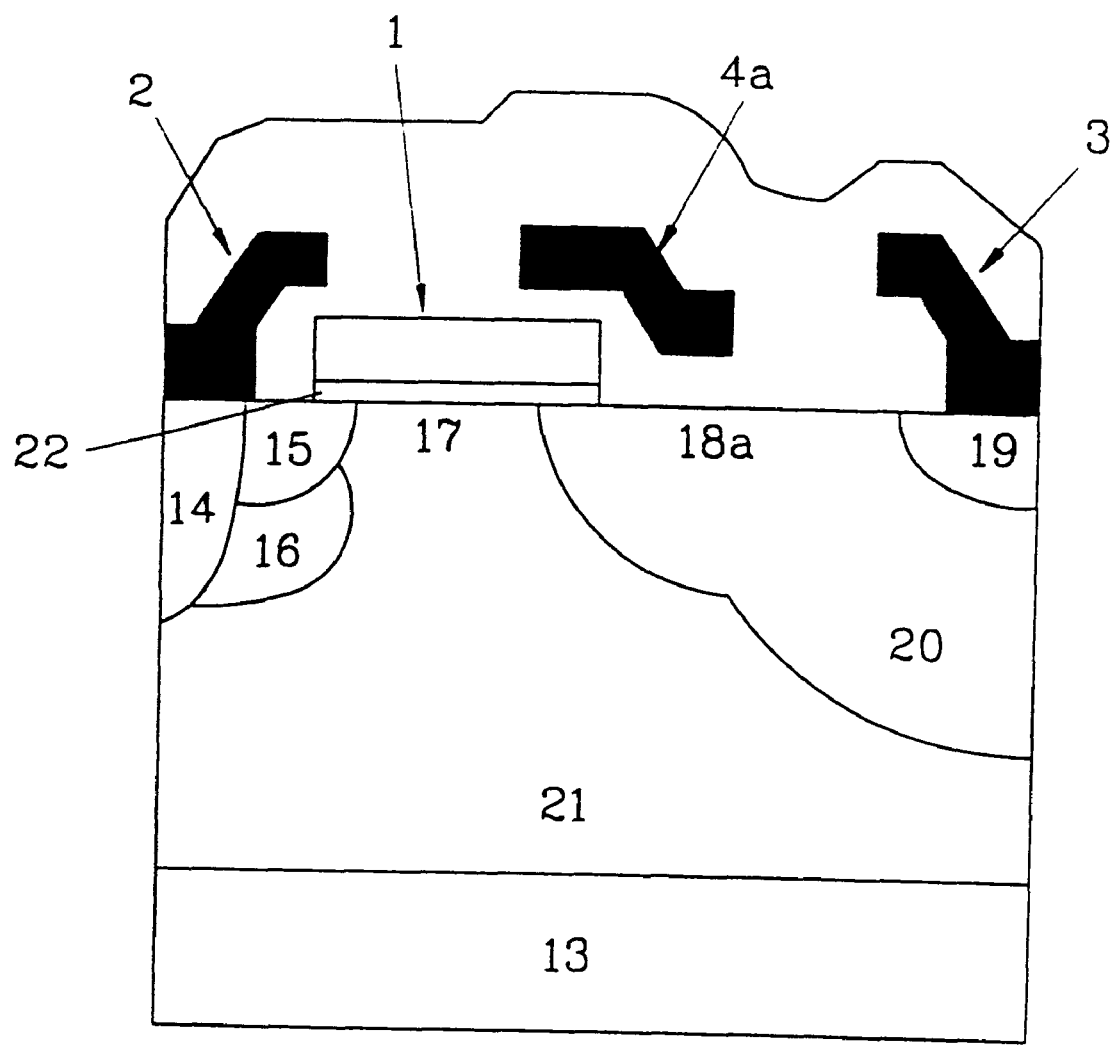

In FIGS. 2(A) and 2(B) are shown n-and p-channel structures of the RESURF EDMOSFET having the said characteristics, respectively.

The method for embodying actually n-and p-channels of the said structure on a semiconductor substrate, is described concretely as follows, by reference to the process flow charts shown in FIGS. 3(A) to 3(H).

Figure 3A:
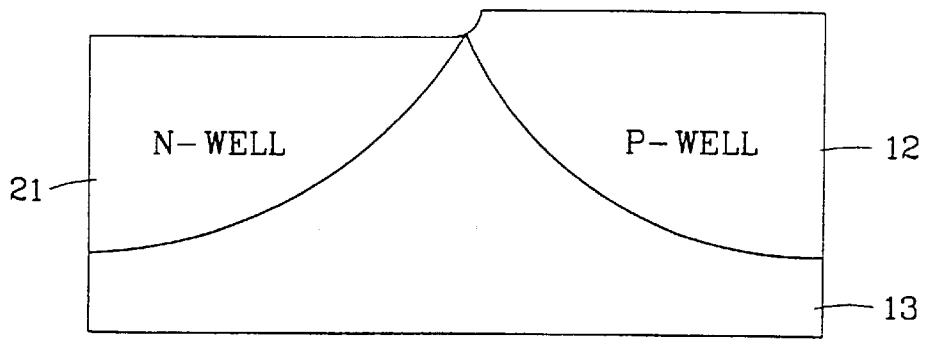
FIGS. 3(A) to 3(N) are process flow charts showing manufacturing method of the RESURF EDMOSFET described in FIG. 2.

As shown in FIG. 3(A), a nitride hard mask is first formed in the manner that the substrate surface of the part on which n-well(21) is to be formed, is exposed on n-or p-type silicon substrate which is a semiconductor substrate(13), and n-type dopants are ion-injected using the said mask. After growing a field oxide on the substrate surface of the part on which n-well is to be formed, the substrate surface of the part on which p-well(12) is to be formed, is exposed by removing the said nitride hard mask, and after ion-injection of p-type dopants in the exposed part of substrate using the said field oxide as mask, n-well(21) and p-well(12) which are active wells (12, 21), by implementing a drive-in in such state, and then the said field oxide is removed.

Since the field oxide is grown in a process forming n-well(21), the surface of silicon substrate is not uniform as seen in the said figure, and a part of the silicon substrate in the area where the field oxide is grown, is etched, and a step is made thereby.

Figure 3B:
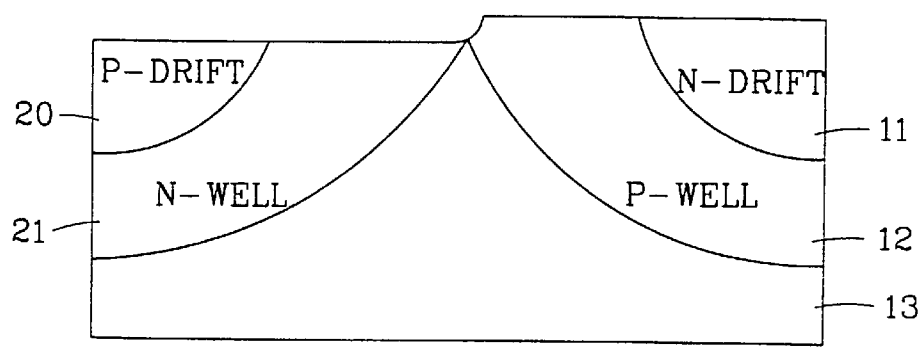

Then, as shown in FIG. 3(B), after a mask is formed in a manner that a specified part of the said p-well(12) surface is exposed, n-type dopants are ion-injected into such exposed part, and then the said mask is removed.

Continuously, after a mask is formed in a manner that a specified part of the said n-well(21) surface is exposed, p-type dopants are ion-injected into such exposed part, and then the said mask is removed. In this state, the drift areas (11, 20) to which most high voltage is applied, are formed by implementing the drive-in at a proper temperature and time. Accordingly, n-type drift area(11) is formed at the said p-well(12), and p-type drift area(20), at the said n-well(21), respectively.

Figure 3C:
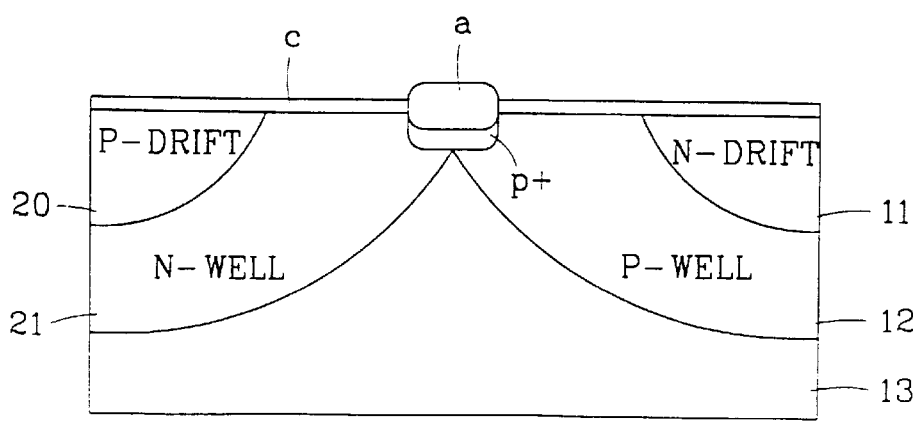

Subsequently, a thin thermal field oxide(c) is formed in thickness of about 400 Z, to isolate elements, as shown in FIG. 3(C), after a nitride film is deposited on it, the nitride film of the part adjacent to the said p-and n-wells(12, 21) is etched using the mask, and then n-channel field stop ion-injection is carried out using it as mask.

Then, a field oxide (a) is grown by the LOCOS method, and the said nitride film is removed. In such process, n-channel field stop ion-injection area is activated concurrently to form p+area in lower part of the said field oxide (a), and it is thereby possible to isolate electrically n-and p-channel elements.

Figure 3D:
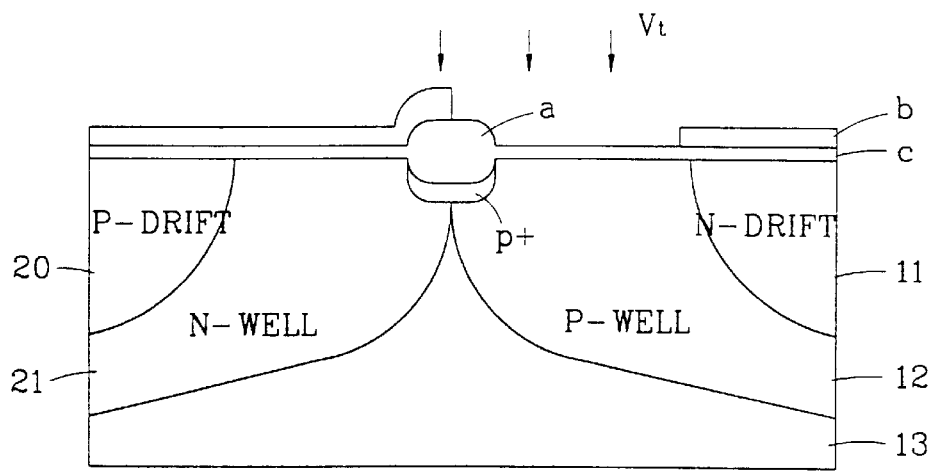
Figure 3E:
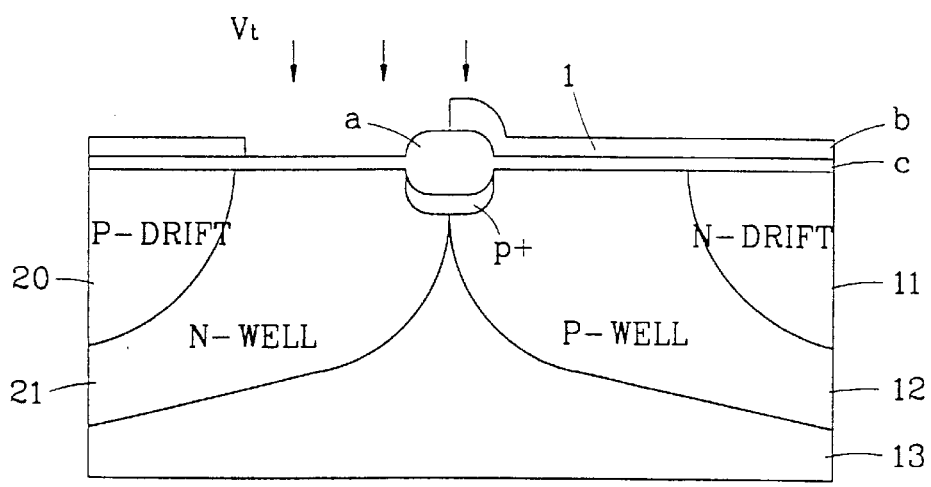

As shown in FIG. 3(D) and 3(E), the ion-injection for adjusting the threshold voltage(Vt) is implemented using photosensitive film (b) as mask, and then the photosensitive film (b) at the left and right of the field oxide for isolation of elements, formed in the said p+area, and the thin field oxide (c) are removed. In FIG. 3(D) is shown a process carrying out ion-injection for adjusting the threshold voltage of n-channel elements, and in FIG. 3(E) is shown a process carrying out ion-injection for adjusting the threshold voltage of p-channel elements.

Continuously, gate field oxides(22) are grown by a thermal oxidation process on substrate surface at the left and right of the field oxide for isolation of elements.

As the gate field oxide (22) is grown, the boron forming p-type drift (20) area is segregated into the said field oxide (22), which results in a drop of doping concentration on surface. In this case, the phosphorus forming n-well (21) is diffused over area in which such doping concentration is low, so that p-type drift area (20) is distorted in its form. For the similar reason, in n-type drift area (11), the boron forming p-well (12) is segregated into the said field oxide (22), so that the doping concentration of p-well (12) on surface becomes low. Therefore, the phosphorus in n-type drift area (11) is diffused over this area, and there happens a pile-up phenomenon.

In such state, N+polycristalline silicon is formed by implementing POCl3 doping, after depositing the polycristalline silicon on the said gate field oxide (22), and then N+polycristalline silicon gate (1) is formed by etching it using a mask.

Figure 3F:
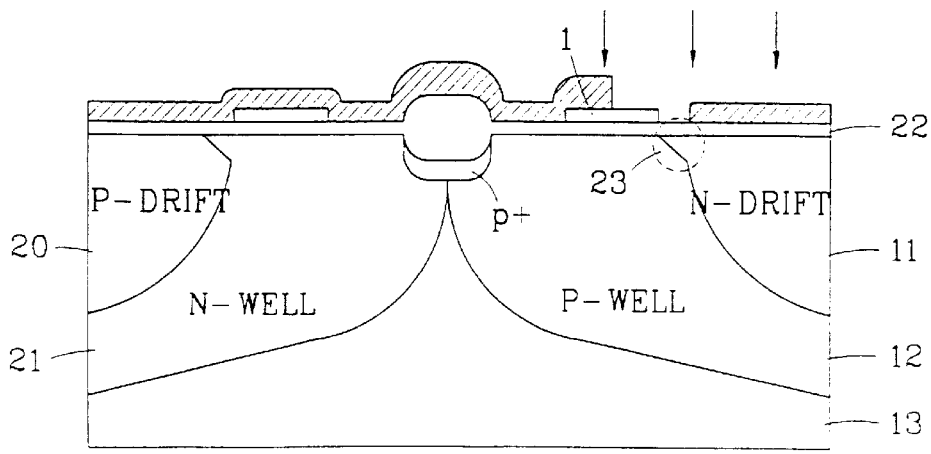

As shown in FIG. 3(F), a mask layer (in the figure, the part indicated by slant lines) is formed on the field oxide (22) including the said N+polycristalline silicon gate (1), in such manner that a specified part of the field oxide (22) formed on n-type drift area (11) on the side adjacent to the gate(1) is exposed, and after n-type lightly doped drift area (23) is formed by self-align at the edge of the gate, with ion-injection of low concentration n-type dopants into such exposed part, the said mask layer is removed.

Figure 3G:
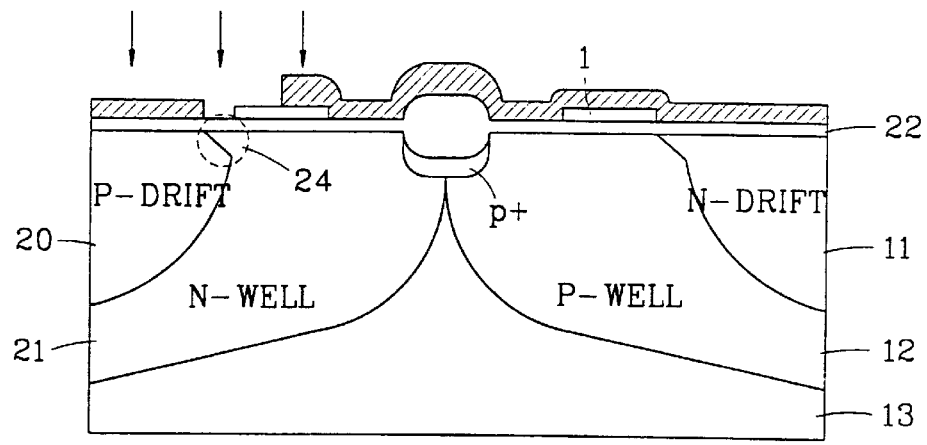

Then, as shown in FIG. 3(G), a mask layer (in the figure, part indicated by slant lines) is formed on the field oxide (22) including the said N+ polycristalline silicon gate (1), in such manner that a specified part of the field oxide (22) formed on p-type drift area (21) on the side adjacent to the gate (1) is exposed, and after forming by self-align p-type LD drift area (24) by ion-injection of low concentration p-type dopants into such exposed part, the said mask layer is removed.

Figure 3H:
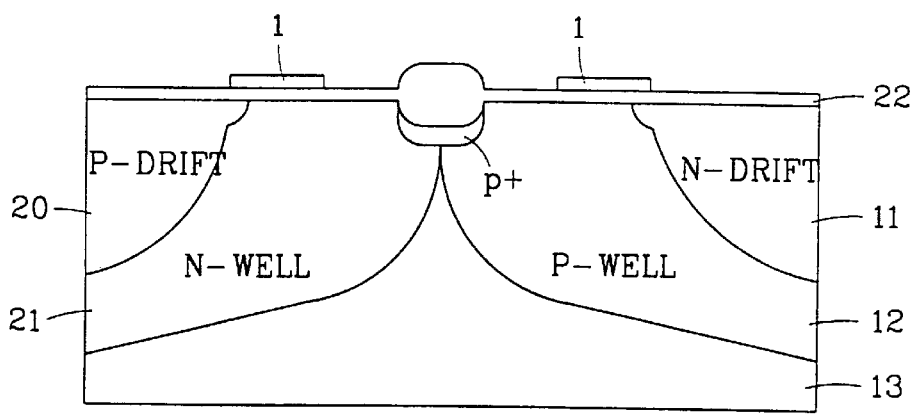

As shown in FIG. 3(H), n- and p-type drift areas (11, 20) are formed additionally on the side adjacent to the gate (1) by implementing a diffusion process.

To form double the drift areas in this way is to prevent any causable factors of defective elements due to misalign in the course of process, for example, a phenomenon, such as short between the said gate (1) and each drift area (11, 20), and the like. Upon advancing the process as above-described, the length of the gate (1) may be reduced considerably compared with any existing elements.

It is the reason that the length of existing elements is formed taking into consideration even defective element factors due to error in process, while the drift area is formed according to the present invention in a form of more or less extended length in horizontal direction through a double diffusion process, and it is possible as a result to reduce the gate length by the increment caused by a process error.

As an example, in case of the RESURF EDMOSFET proposed by the present invention, it is possible to form the length of gate in the limit of 1.2 $\mu$m to 1.5 $\mu$m, on the basis of 100(V) elements, and a reduction in size of elements enables the area occupied by such elements in a system to be reduced so much.

Figure 3I:
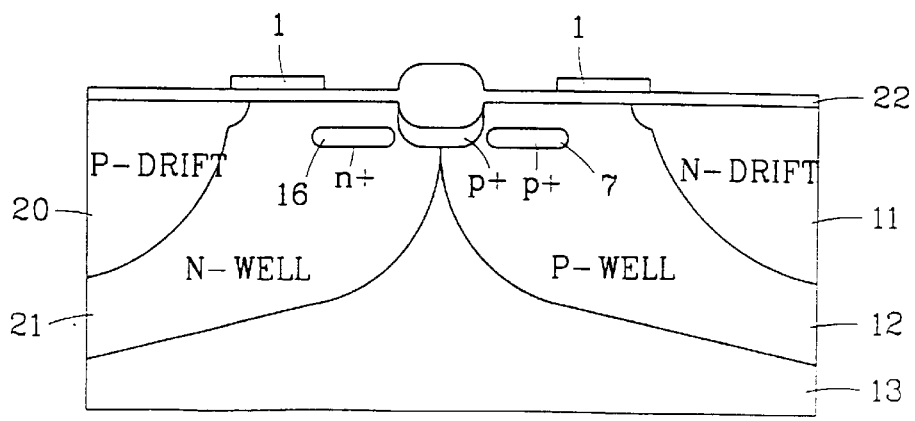

In order to restrain a latch-up phenomenon caused by parasitic bipolar transistors, high concentration n-type dopants is first ion-injected by high energy using a mask, after self-aligning to N+ polycristalline silicon gate (1) of p-channel element, and then p-type dopants in high concentration is ion-injected by high energy using the mask after self-aligning to N+ polycristalline silicon gate (1) of n-channel element, and finally after activating them, a buried N+ area (16) is formed in n-well (21) and a buried p+ area (7), in p-well (12), respectively, as shown in FIG. 3(I).

Figure 3J:
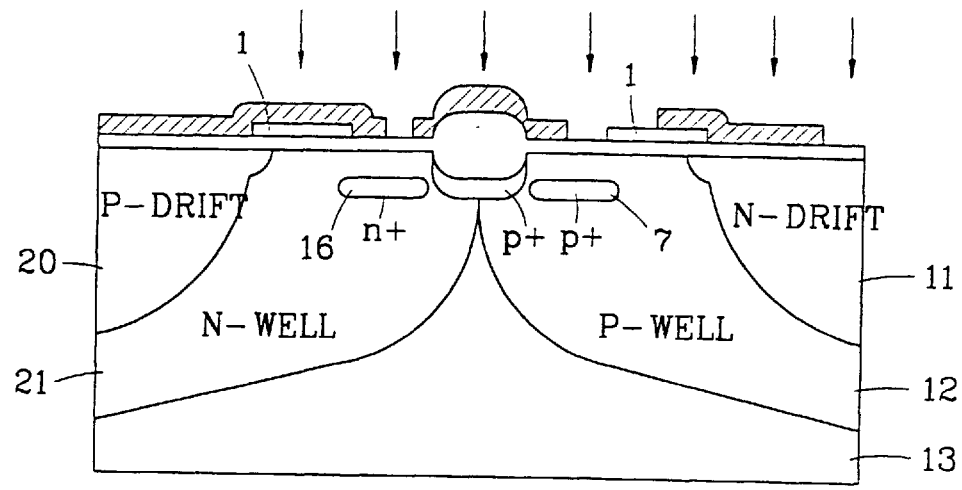

Subsequently, as shown in FIG. 3(J), a mask layer (in the figure, part indicated by slant lines) is formed over the entire surface of the substrate (13) including n+ polycristalline silicon gate (1), and after etching it in such way that a part of the field oxide surfaces on the buried n+ area (16), p+ area (7) and the surface of n-type drift area (11) is exposed, as shown in the said figure, N+ source/drain is ion-injected into such exposed part, and then the said mask layer is removed.

Figure 3K:
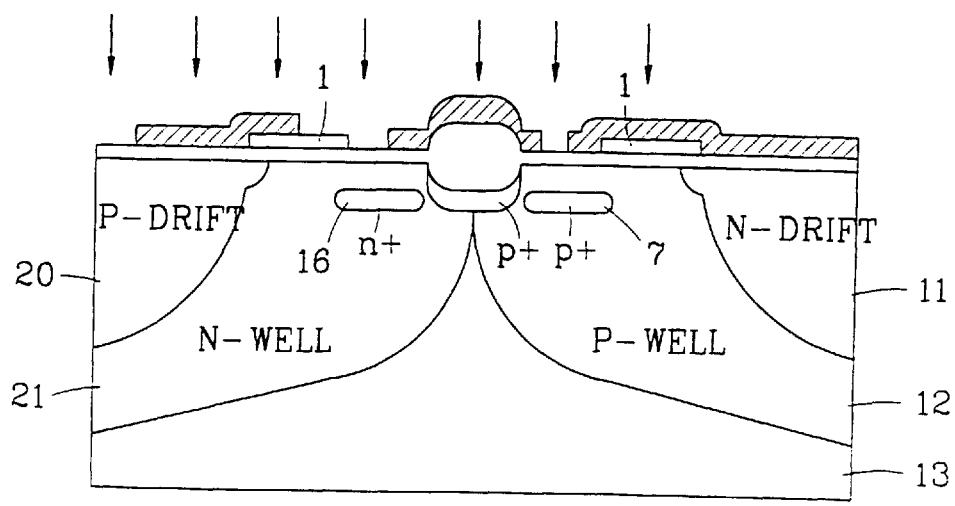

Then, as shown in FIG. 3(K), a new mask layer ( in the figure, part indicated by slant lines) is formed over the entire surface of the substrate including N+ polycristalline silicon gate (1), and after etching it in such way that a part of the field oxide surfaces on the said buried N+ area (16) and p+ area (7) and the surface of p-type drift area (20), is exposed as shown in the said figure, p+ source/drain is ion-injected into such exposed part, and then the said mask layer is removed.

Figure 3L:
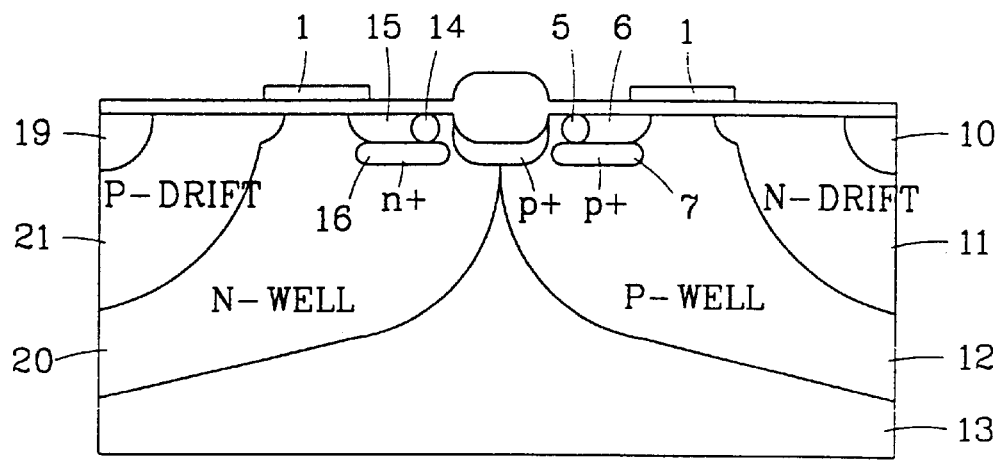

As shown in FIG. 3(L), the said ion-injected area is activated. As a result, N+ SOS (6) having p+ body contact (5) formed so as to be adjacent to one side, is formed in the buried p+ area (7), and N+ type drain (10) is formed in n-type drift area (11), while p+ source having N+ body contact (14) formed so as to be adjacent to one side, is formed in the buried N+ area (16), and p+ drain (19) is formed in p type drift area (21). That is, n-channel is formed in the said p-well (12), and p-channel is formed in the said n-well (20).

Figure 3M:
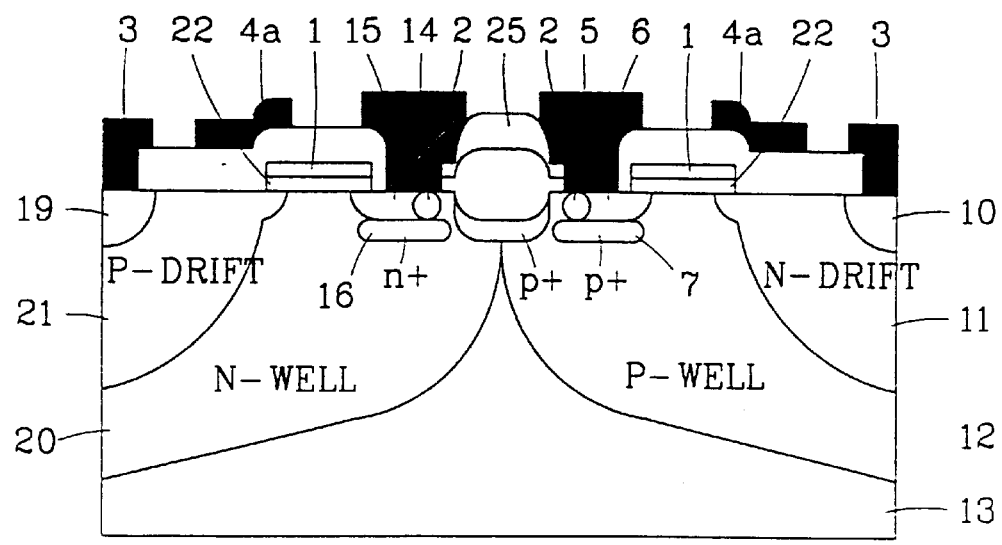

And then, as shown in FIG. 3(M), after depositing a silicon field oxide (25) as insulation film over the entire surface of substrate including the said gate, and etching it in such way that a specified part of the source and drain using a mask, the contact is formed. Subsequently, a metal film for forming electrodes is deposited over the entire surface of the silicon field oxide (25) including the said contact, and after selecting and etching it, the source/drain electrodes (2, 3) and the metal field plate (4a) are formed.

Figure 3N:
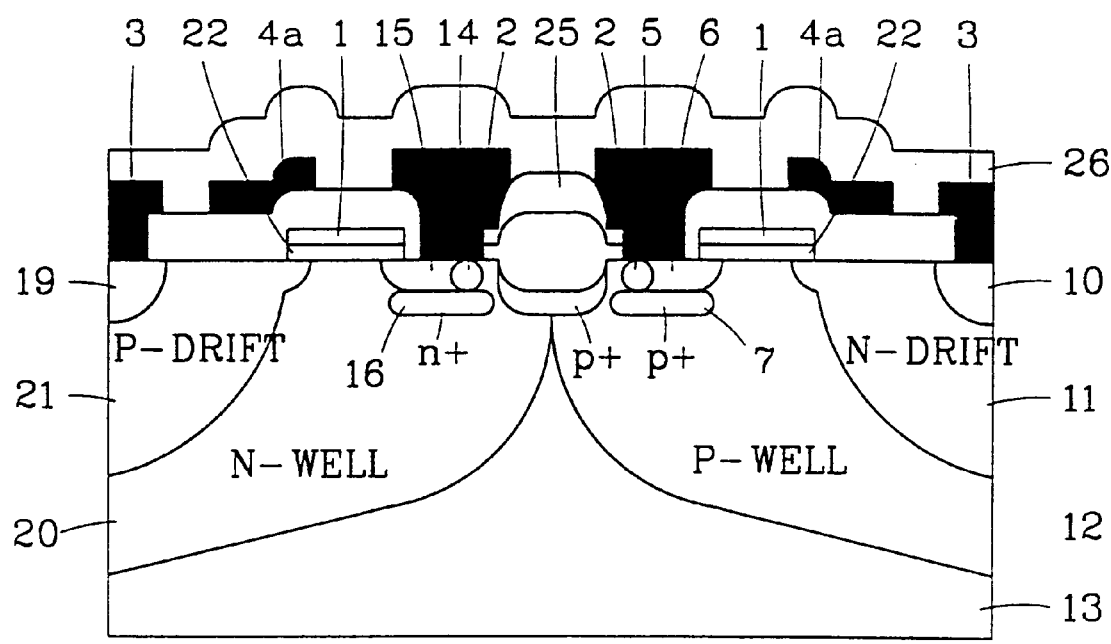

Finally, as shown in FIG. 3(N), this process is completed by depositing the field oxide (26) which is a passivation film, over the entire surface of the silicon field oxide (25) including the said source and drain electrodes (2, 3) and metal field plate (4a), and etching the field oxide on the pad.

In this case, the limit of the application yield voltage of the said high voltage EDMOSFET is 20V to 600V, which is obtainable by changing the well doping profile, drift doping profile, lengths of drift area and gate, under the optimum condition.

On the other hand, the said manufacturing process may be implemented even by a single well mode, not by the twin well mode as above-described, but it proceeds in the same way as in FIG. 3, with exception that only one well is formed selectively, and the detailed description thereof is omitted.

The operation of the RESURF EDMOSFET manufactured through such a series of process is described as follows, but since n-and p-channel RESURF EDMOSFET is operated by the same principle, only the operation of n-channel RESURF EDMOSFET is described here.

The operation of n-channel RESURF EDMOSFET is described as follows: when a voltage higher than the threshold voltage is applied to N+ polycristalline silicon gate (1), and a high voltage compared with the voltage of source electrode (2) terminal is applied to a terminal of drain electrode (3), electrons flow in the drain (10) from the source (6) through the channel area (8) and part (9a) of the drift area, without distorting the current conduction path. In such process, the metal field plate (4a) prevents any breakdown phenomenon from occurring at the end of gate on a side near the drain (10), the said element enables the breakdown voltage to be increased, and when any adequate voltage is applied to the metal field plate (4a), the current conduction path in the drift area can be improved, and which results in improvement of the conduction resistance.

For instance, in case of an optimal design of 100(V) n-channel EDMOSFET using the above-described structure, the breakdown voltage is 101.5 (V), and the conduction resistance is 1.14 m cm2, which, proved as a result of experiments, represent the most excellent characteristics as horizontal power elements reported until now.

It is possible that the said RESURF EDMOSFET is driven by the following two ways depending on the characteristics demanded by users. The one is to increase the breakdown voltage and to improve at the same time the characteristic of the conduction resistance, by applying the voltage of gate (1) to the metal field plate (4a), and the other, to reduce the conduction resistance by applying any specified voltage different from that of gate(1) to the metal field plate (4a).

Figure 4A:
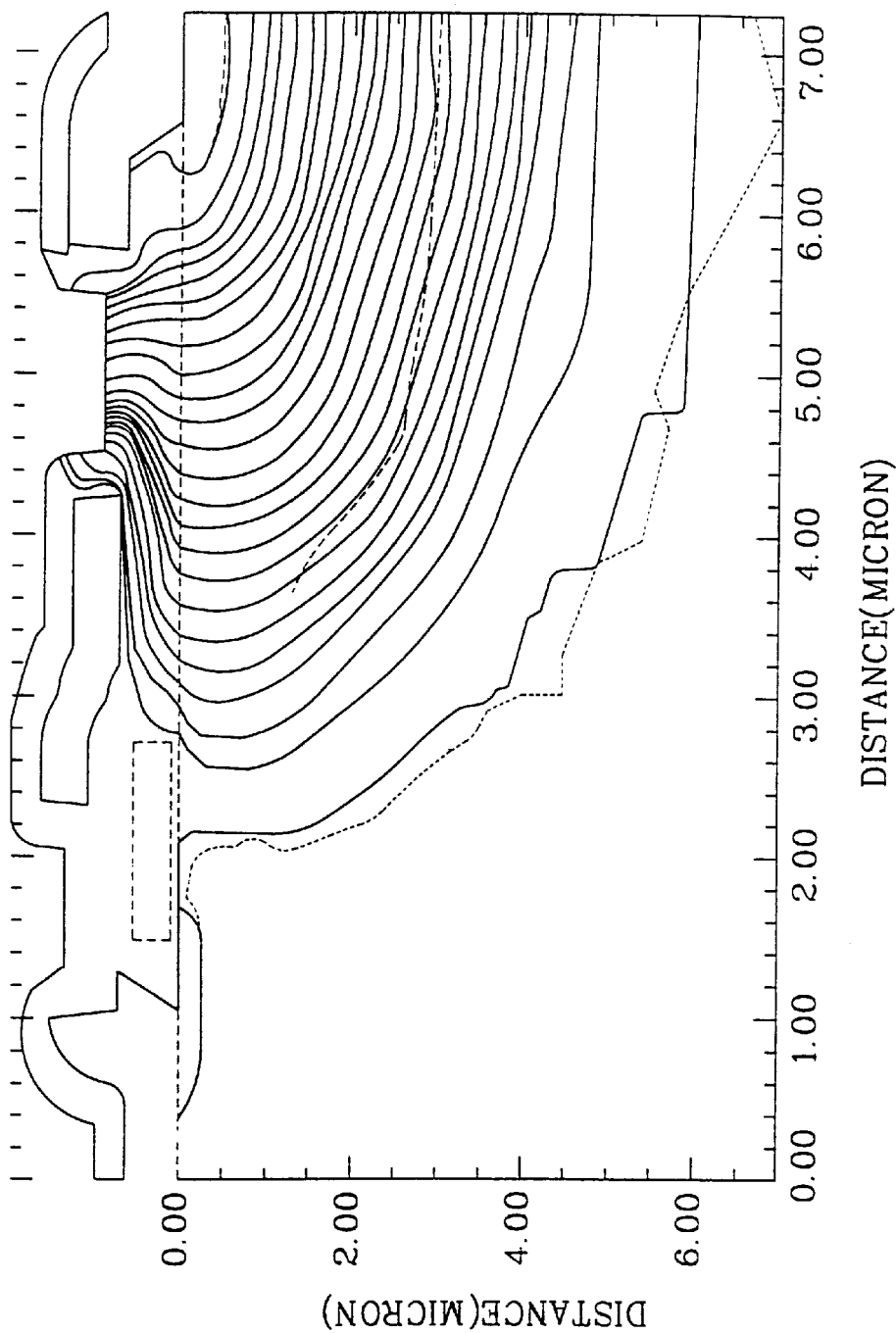
Figure 4B:
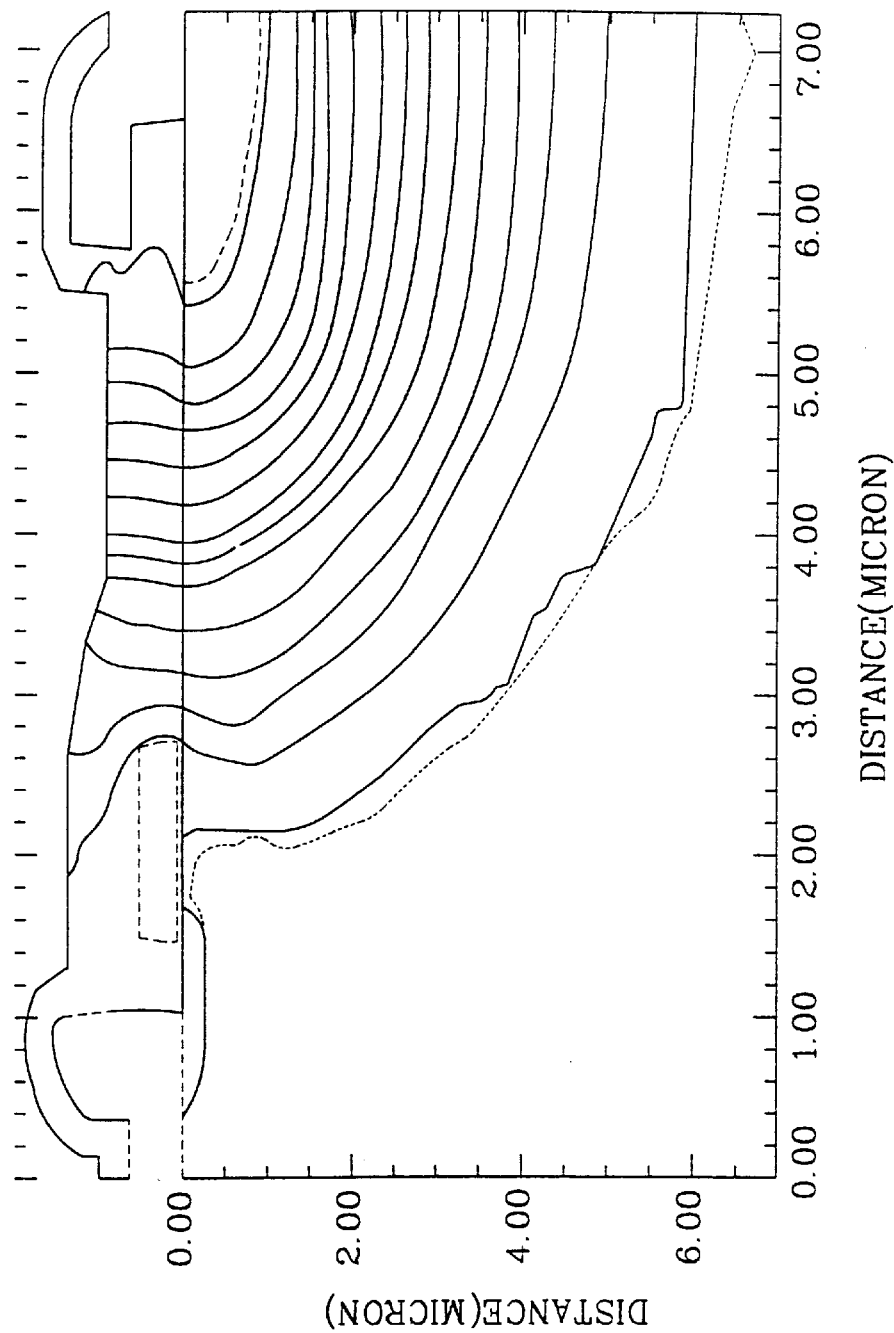

In FIG. 4(A) and 4(B), the distribution of voltage is shown in comparison with each other, when the maximum breakdown voltage is applied between the source and drain of the element, in cases where the metal field plate is and is not formed at the RESURF EDMOSFET as described in FIG. 2.

FIG. 4(A) shows a distribution of the voltage equipotential line up to the maximum breakdown voltage, when the breakdown voltage is 101.5(V), and the voltage applied to the drain is 100(V), in case where the metal field plate is formed.

In this case, as the maximum field vector is leaded towards the field oxide of gate at the end of the polycristalline silicon gate (1) on the drain side, as shown in the said figure, the equipotential line of voltage continues to expand towards the drain area (10).

On the other hand, FIG. 4(B) shows a distribution of voltage equipotential line up to the maximum breakdown voltage, when the breakdown voltage is 68(V), and the voltage applied to the drain is 70(V), in case where the metal field plate is not formed.

In this case, since there is no metal field plate as shown in the said figure, the equipotential lines are collected at the end of polycristalline silicon gate (1) on the drain side, and all equipotential lines are thereby expanded towards the drain area (10), so that a breakdown phenomenon occurs at the end of the polycristalline silicon gate (1) on the drain side.

That is to say, it becomes apparent from the said result, that the breakdown voltage may be increased by using a metal field plate.

Figure 5B:
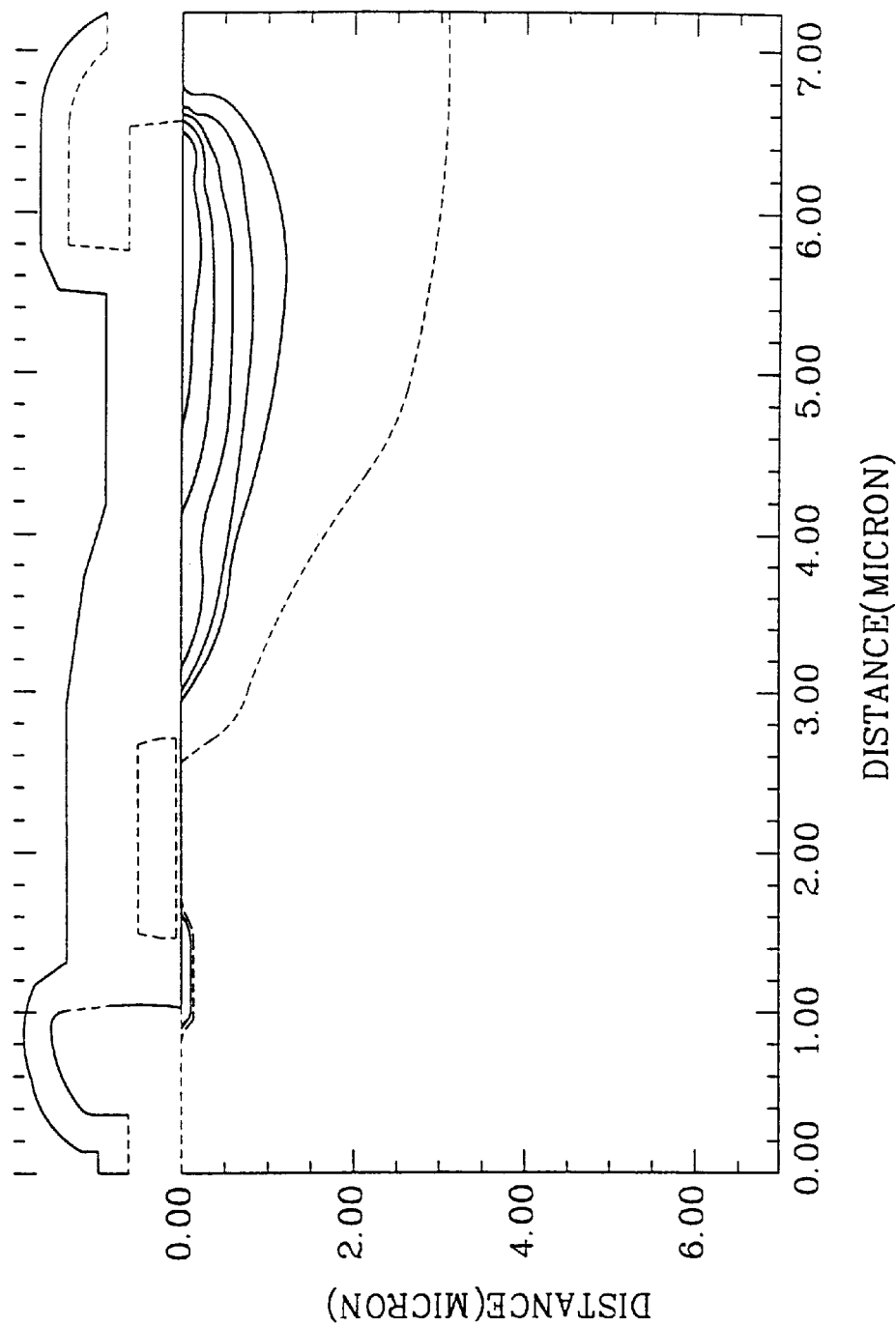

In FIG. 5(A) and 5(B), the current conduction paths are shown in comparison with each other in cases where a metal field plate is and is not formed.

FIG. 5(A) shows a case where a metal field plate is formed, in which it is shown detailed how the current conduction path is changed as a proper voltage is applied to the metal field plate. In this case, it shows the shape of the current conduction path made in drift area by applying an equal voltage to the metal field plate together with the gate (1).

On the other hand, FIG. 5(B) shows as a linear area the current conduction path, in case where a metal field plate.

In FIG. 5(A), when a proper voltage is applied to the metal field plate, the current conduction path becomes narrower in the position (9a) in FIG. 2, compared with the case where the metal field plate is not formed. However, a carrier constituting the current flowing in the drift area below such metal field plate, concentrates and flows on the surface of drift area, so that the current conduction path gets short, and the conduction resistance may thereby be reduced. In case of n-channel element, as a high positive voltage is applied to a source on the metal field plate, and in case of p-channel element, as a high negative voltage is applied to a source on the metal field plate, electrons are accumulated so much in the position (9a) of FIG. 2 in case of n-channel element, and holes, in case of p-channel element, respectively, that the current in the linear area, by which the conduction resistance is determined, is increased still more.

Figure 6:
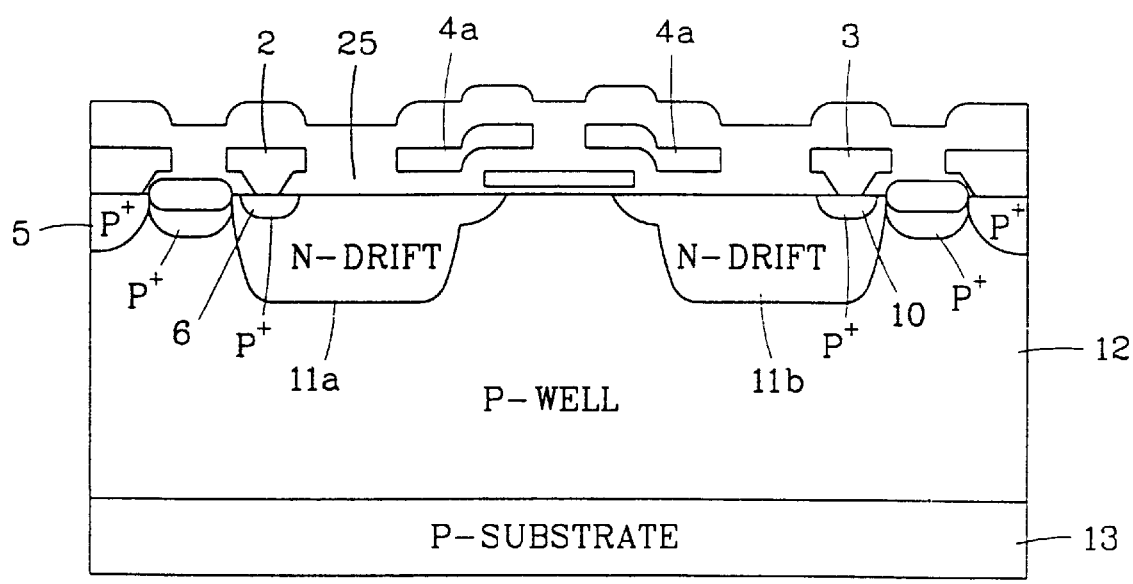
FIG. 6 is a cross-sectional view showing a structure of n-channel bi-directional ESURF EDMOSFET according to the present invention.

The said RESURF EDMOSFET is not only driven in a uni-direction, but in bi-direction. If it is desired to make a bi-directional drive, it is sufficient to form a drift area even at the end of source in the substrate. FIG. 6 shows in sectional view a structure of such n-channel bi-directional RESURF EDMOSFET. As above-mentioned, the structure of p-channel bi-directional RESURF EDMOSFET is substantially identical to the basic structure of n-channel element, except only dopants doping with n-channel elements, and the sectional view thereof is here omitted.

As it is obvious in the said figure, the bi-directional RESURF EDMOSFET is principally identical in structure to the uni-directional RESURF EDMOSFET, with an exception that the drift area (11) existing only in the drain is made even at the end of source, so that if a high voltage is applied to the drain or source without distinction, the one of terminals thereof may play a role of the drain and the other, a role of the source, respectively.

In this case, since the source is not fixed to the terminal of body contact (5), it is formed separately at both ends of the drift area (11) as shown in the said figure, by means of ion-injection of any substance such as the said well (12). p+ area in the said figure corresponds to it.

The manufacturing method of n-channel RESURF EDMOSFET is described briefly by reference to a process flow chart as shown in FIG. 7(A) to 7(E). The manufacturing method of p-channel RESURF EDMOSFET takes a process similar to the manufacturing process of n-channel RESURF EDMOSFET, and the description on the manufacturing method of the former is here omitted.

Figure 7A:
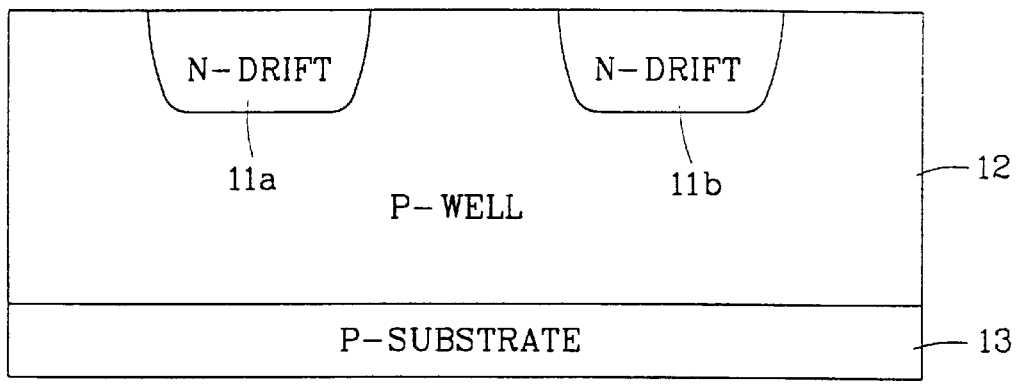
FIGS. 7(A) to 7(E) are process flow charts showing the manufacturing process of n-channel bi-directional RESURF EDMOSFET as described in FIG. 6.

In order to form an active area for inserting n-channel element of high voltage in p-type substrate (13), as shown in FIG. 7(A), p-well (12) is formed through p-type dopants ion-injection and diffusion process, and then the first and second n-type drift areas (11a, 11b) are formed in the said p-well (12) using a mask, by implementing again n-type dopants ion-injection and diffusion process.

Figure 7B:
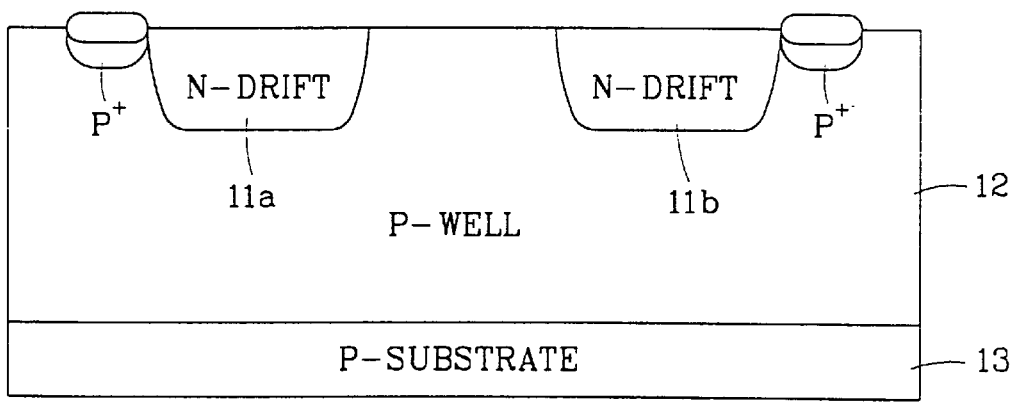

Then, as shown in FIG. 7(B), a thick field oxide is grown at both edges of the first and second drift areas (11a, 11b), by applying the LOCOS process.

Figure 7C:
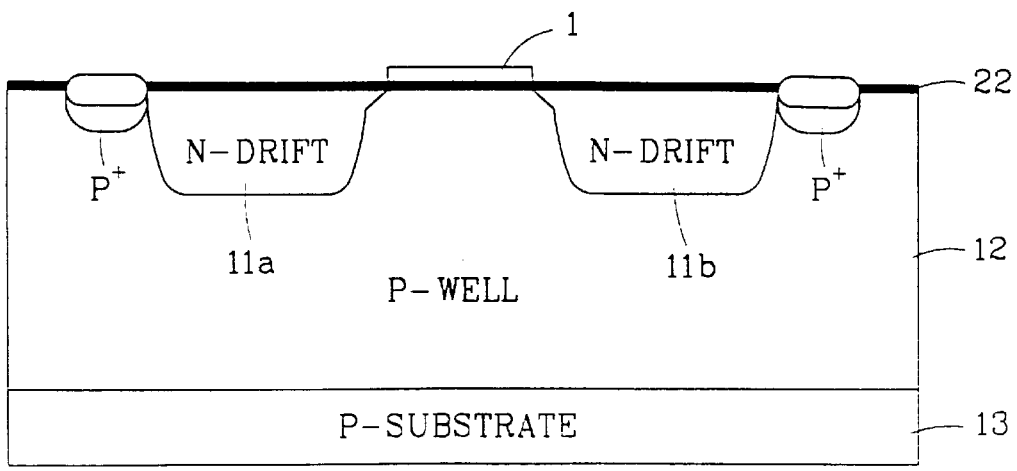

Subsequently, as shown in FIG. 7(C), a gate field oxide (22) is grown by applying thermal oxidation process, on the substrate between the said field oxides, polycrystalline silicon is deposited on it, N+ polycrystalline silicon layer is formed by POCl3 doping, and etched selectively using a mask to form the gate (1) on the substrate between the first and second drift areas (11a, 11b).

In this case, as a gate field oxide (22) is grown, the boron constituting p-well penetrates into the said field oxide, and the doping concentration of p-well becomes low on the surface, and phosphorus in n-type drift area (11) diffuses over this area, and a pile-up phenomenon occurs, as described for the foregoing process, so that the drift area has such shape as shown in the figure.

In case of p-channel element, since there occurs a phenomenon according to the same principle, that the boron constituting p-type drift area (20) penetrates into the field oxide (22), and the doping concentration becomes low on the surface, and thereby the phosphorus forming n-well diffuses over lower doping concentration area, so that any distortion of a form as shown in FIG. 3(F) takes place in p-type drift area.

Figure 7D:
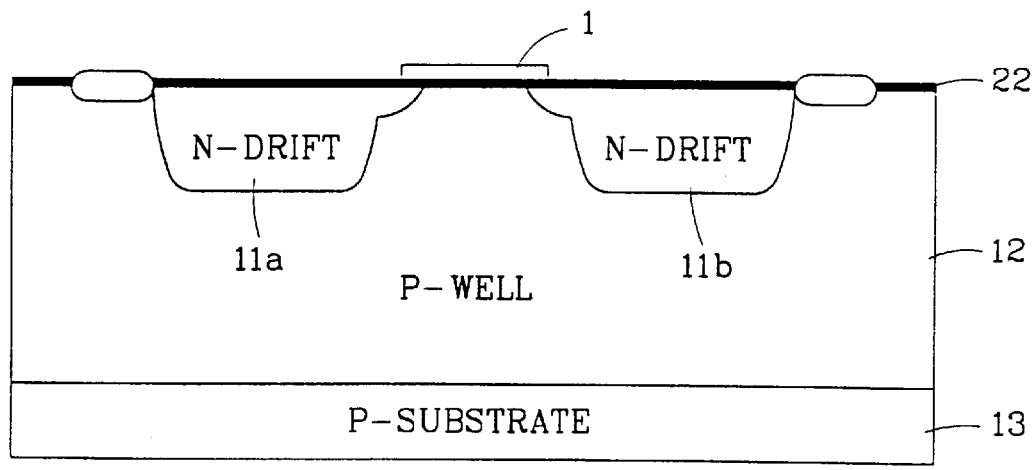

As shown in FIG. 7(D), a mask layer is formed on the field oxide (22) including the said n+ polycrystalline silicon gate (1), in such way that a specified part of the field oxide (22) formed on n-type drift area (11) on the side adjacent to the gate (1), is exposed, and after forming n-type lightly doped (LD) ion-injection area (23) by ion-injection of low concentration n-type dopants in such exposed part, the said mask layer is removed, and a n-type drift area is formed additionally on the side adjacent to the gate (1), by implementing the diffusion process.

Figure 7E:
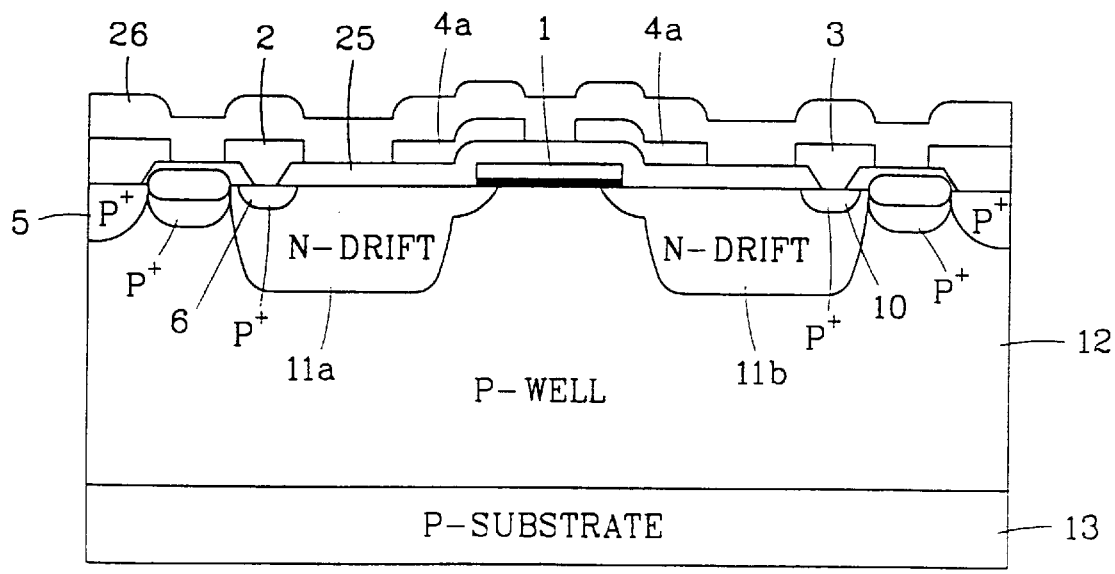

As shown in FIG. 7(E), the source/drain (6, 10) is formed by ion-injection and diffusion of high concentration n-type dopants in the said first and second n-type drift areas, p+ body contact (5) is formed by ion-injection and diffusion of high concentration p-type dopants on both sides of the field oxide formed on both edges of the said first and second drift areas (11a, 11b), and then the gate field oxide (22) on the part excluding lower part of the said N+ polycrystalline silicon gate (1) is removed.

Continuously, a silicon field oxide (25) is deposited as insulation film on the entire surface of the substrate including the said gate (1), and then a contact is formed by etching it using a mask, in such way that a specified part of the source/drain (6, 10) and p+ body contact (5) is exposed.

Subsequently, this process is completed by depositing metal film for forming electrodes over the silicon field oxide (25) including the said contact, forming by selecting and etching it, source and drain electrodes (2, 3) and the first and second metal field plates (4*a*), and then depositing the field oxide (26) which is a passivation film, over the entire surface of the silicon field oxide (25) including the said source and drain electrodes (2, 3) and the first and second metal field plates (4*a*).

It is possible to carry out the said manufacturing process by the single well mode different from the twin well mode as above-described, and it is identical to the process as described in FIG. 7, except in that only a single well is formed by the process as described in FIG. 7. The detailed description is, therefore, omitted.

As above-described, according to the present invention, (1) a metal field plate is formed during formation of metal lead wire (eg. source/drain electrodes), and proper voltage is applied to it, so that it is not required to take any separate additional manufacturing process for forming a field plate, and to adjust it so as to hold low threshold voltage; (2) it is possible to obtain low conduction resistance and high breakdown voltage by excluding a current distortion path; (3) it is possible to reduce sharply the area occupied by elements in the system due to reduction of the drift area and the gate length; and (4) it is possible to embody the most reliable high voltage MOSFET capable of reducing the calorific power in chips compared with existing elements.

What is claimed is:

1. A method for manufacturing the high voltage MOSFET, comprising a process forming the first and second conductive wells in a semiconductor substrate; process forming drift areas in the said first and second conductive wells; process growing an isolation membrane on the substrate surface between the said first and second conductive wells; process forming a gate insulation film; process forming a gate on the gate insulation film above the said first and second conductive wells; process forming low concentration n-and p-type dopant areas in the drift areas of the part adjacent to the said gate; process forming a buried diffusion area in the said first and second conductive wells; process forming source/drain having a body contact on a side on the buried diffusion area in the said first and second conductive wells; process forming the insulation film having a contact formed in such way that the source/drain surface is exposed, on the entire surface of the substrate including the said gate and isolation membrane; process forming a metal film on the said insulation film; and process forming source/drain electrodes and metal field plates by etching the said metal film using a mask.

2. The method for manufacturing the high voltage MOSFET according to claim 1, wherein the first conductive well is formed through a process diffusing p-type dopants after ion-injection.

3. The method for manufacturing the high voltage MOSFET according to claim 1, wherein said second conductive well is formed through a process diffusing n-type dopants after ion-injection.

4. The method for manufacturing the high voltage MOSFET according to claim 1, wherein the process forming low concentration n-and p-type dopant areas in the drift area of a part adjacent to the said gate, further comprising a process forming the first mask layer on the entire surface of the insulation film including the said gate; process etching the said first mask layer in such way that is exposed a specified part of the insulation film on a side adjacent to the gate on the drift area formed in the said second conductive well; process ion-injecting low concentration n-type dopants in such exposed party by a self-align with the said gate, and then removing the said first mask layer; process forming the second mask layer on the entire surface of the gate insulation film including the said gate; process etching the said second mask layer in such way that is exposed a specified part of the insulation film on a side adjacent to the gate on the drift area formed in the said first conductive well; process ion-injecting low concentration p-type dopants in such exposed part by a self-align with the said gate, and then removing the said second mask layer; and process implementing the diffusion.

5. The method for manufacturing the high voltage MOSFET according to claim 1, wherein the process forming a source/drain having a body contact formed on a side on the buried diffusion area in the said first and second conductive wells, further comprises a process forming the first mask layer on the entire surface of the insulation film including the said gate; process etching the said first mask layer in such way that are exposed specified parts of the surface of insulation film on the buried diffusion area formed in the said first conductive well and the surface of insulation film on the buried diffusion area formed in the second conductive well; process ion-injecting high concentration n-type dopants in such exposed parts, and then removing the said first mask layer; process forming the second mask layer on the entire surface of the insulation film including the said gate; process etching the said second mask layer in such way that are exposed specified parts of the surface of insulation film on the buried diffusion area formed in the said first conductive well, and the surface of insulation film on the buried diffusion area formed in the second conductive well; process ion-injecting high concentration p-type dopants in such exposed parts, and then removing the said second mask layer; and process activating the said ion-injection area.

6. The method for manufacturing the high voltage MOSFET according to claim 1, wherein the gate is formed in the length of 1.2 μm to 1.5 μm.

7. The method for manufacturing the high voltage MOSFET according to claim 1, wherein to the said metal field plate is applied the gate voltage, or a constant voltage separate from the gate voltage.

8. The method for manufacturing the high voltage MOSFET according to claim 1, wherein said high voltage MOSFET is formed so as to hold the value of breakdown voltage ranging from 20V to 600V.

9. A method for manufacturing the high voltage MOSFET, comprising a process forming the first and second conductive wells in a semiconductor substrate; process forming the first and second p-type drift areas in the said first conductive well; process forming the first and second n-type drift areas in the said second conductive well; process growing an isolation membrane on the substrate surface between the said first and second conductive wells; process growing field oxides at both edges of the said first and second p-type drift areas and the said first and second n-type drift areas; process forming gate insulation films; process forming gates on the gate insulation film between the said first and second n-type drift areas, and on the gate insulation film between the said first and second p-type drift areas; process forming low concentration n-and p-type dopants in the first and second p- and n-type drift areas of parts adjacent to the said gate; process forming the source/drain areas in the said first and second p- and n-type drift areas, and forming simultaneously body contacts on both sides of the field oxide; process forming an insulation film having a contact formed in such way that the source/drain areas and body contact surfaces are exposed, over the entire surface of the substrate including the said gate and isolation membrane; process forming a metal film on the said insulation film; and process forming the source/drain electrodes and the first and second metal field plates, by selecting and etching the said metal film.

10. The method for manufacturing the high voltage MOSFET according to claim 9, wherein said first conductive well is formed through a process diffusing p-type dopants after ion-injection.

11. The method for manufacturing the high voltage MOSFET according to claim 9, wherein said second conductive well if formed through a process diffusing n-type dopants after ion-injection.

12. The method for manufacturing the high voltage MOSFET according to claim 9, wherein the process forming low concentration n- and p-type dopants in the first and second p- and n-type drift areas in parts adjacent to the said gate, further comprises a process forming the first mask layer over the entire surface of the insulation film including the said gate; process etching the said first mask layer in such way that are exposed specified parts of the insulation films in the first and second n-type drift areas on the left and right of lower part of the said gate; process ion-injecting low concentration n-type dopants in such exposed parts, and then removing the said first mask layer; process forming the second mask layer over the entire surface of the insulation film including the said gate; process etching the said second mask layer in such way that are exposed specified parts of the insulation film on the first and second p-type drift areas on the left and right of lower part of the said gate; process ion-injection low concentration p-type dopants in such exposed parts, and then removing the said second mask layer; and process implementing the diffusion.

13. The method for manufacturing the high voltage MOSFET according to claim 9, wherein the process forming the source/drain areas in the said first and second p- and n-type drift areas, and forming simultaneously the body contacts on both sides of the field oxide, further comprises a process forming the first mask layer over the entire surface of the insulation film including the said gate; process etching the said first mask layer in such way that are exposed specified parts of the surfaces of the said first and second p-type drift areas, and on the substrate surface on the left and right of the field oxides formed at both edges of the first and second n-type drift areas; process ion-injecting high concentration p-type dopants in such exposed parts, and then removing the said first mask layer; process forming the second mask layer over the entire surface of the insulation film including the said gate; process etching the said second mask layer in such way that are exposed specified parts of the surfaces of the said first and second n-type drift areas, and on the substrate surface on the left and right of the field oxides formed at both edges of the first and second p-type drift areas; process ion-injecting high concentration n-type dopants in such exposed parts, and then removing the said second mask layer; and process activating the said ion-injected areas.

14. The method for manufacturing the high voltages MOSFET according to claim 9, wherein said gate is formed in length of 1.2 $\mu$m to 1.5 $\mu$m.

15. The method for manufacturing the high voltage MOSFET according to claim 9, wherein to the said metal field plate is applied the gate voltage or a constant voltage separate from the gate voltage.

16. The method for manufacturing the high voltage MOSFET according to claim 9, characterized in that the said high voltage MOSFET is formed so as to hold the value of breakdown voltage ranging from 20V to 600V.

17. A method for manufacturing the high voltage MOSFET, comprising a process forming the first conductive well in a semiconductor substrate; process forming a drift area in the said first conductive well; process forming a gate insulation film on the substrate in which the said drift area is formed, and then forming a gate on it; process forming low concentration n-or p-type dopant area in the drift area of the part adjacent to the said gate; process forming a buried diffusion area in the said first conductive well; process forming a source/drain having body contact formed on a side above the buried diffusion are in the said first conductive well; process forming an insulation film having a contact formed in such way that the surface of the source/drain is exposed on the substrate including the said gate; process forming a metal film on the said insulation film; and process forming the source/drain electrodes and metal field plates by etching the said metal film using a mask.

18. The method for manufacturing the high voltage MOSFET according to claim 17, wherein said first conductive well is formed through a process diffusing p- or n-type dopants after ion-injection.

19. The method for manufacturing the high voltage MOSFET according to claim 17, wherein the process forming low concentration n- or p-type dopant area in the drift area of the part adjacent to the said gate, further comprises a process forming a mask layer over the entire surface of the insulation film including the said gate; process etching the said mask layer in such way that is exposed a specified part of the insulation film on the side adjacent to the gate on the said drift area; process ion-injecting low concentration n- or p-type dopants in such exposed part by a self-align with the said gate; and then removing the said mask layer; and process implementing the diffusion.

20. The method for manufacturing the high voltage MOSFET according to claim 17, wherein the process forming the source/drain having a body contact formed on a side on the buried diffusion area in the said first conductive well, further comprises a process forming a mask layer over the entire surface of the insulation film including the said gate; process etching the said mask layer in such way that the surface of the insulation film on the said buried diffusion area is exposed; process ion-injection high concentration n- or p-type dopants in such exposed part, and then removing the said mask layer; and process activating the said ion-injected area.

21. The method for manufacturing the high voltage MOSFET according to claim 17, wherein said gate is formed in length of 1.2 $\mu$m to 1.5 $\mu$m.

22. The method for manufacturing the high voltage MOSFET according to claim 17, wherein to the said metal field plate is applied the gate voltage or a constant voltage separate from the gate voltage.

23. The method for manufacturing the high voltage MOSFET according to claim 17, wherein said high voltage MOSFET is formed so as to hold the value of breakdown voltage ranging from 20V to 600V.

24. A method for manufacturing the high voltage MOSFET, comprising a process forming the first conductive well in a semiconductor substrate; process forming the first and second drift areas in the said first conductive well; process growing field oxides at both edges of the said first and second drift areas; process forming a gate insulation film; process forming a gate on the gate insulation film between the said first and second drift areas; process forming low concentration n- or p-type dopants in the first and second drift areas of parts adjacent to the said gate; process forming source/drain areas in the said first and second drift areas, and forming simultaneously body contacts on both sides of the field oxide; process forming an insulation film having a contact formed in such way that are exposed the source/drain areas and body contacts, over the entire surface of the substrate including the said gate; process forming a metal film on the said insulation film; and process forming source/drain electrodes and the first and second metal field plates, by etching the said metal film using a mask.

25. The method for manufacturing the high voltage MOS-FET according to claim 24, wherein said first conductive well is formed through a process diffusing n- or p-type dopants after ion-injection.

26. The method for manufacturing the high voltage MOS-FET according to claim 24, wherein the process forming low concentration n- or p-type dopant areas in the first and second drift areas of parts adjacent to the said gate, further comprises a process forming a mask layer over the entire surface of the insulation film including the said gate; process etching the said mask layer in such way that are exposed specified parts of the insulation film on the first and second drift areas on the left and right of lower parts of the said gate; process ion-injecting low concentration n- or p-type dopants in such exposed parts, and then removing the said mask layer; and process implementing the diffusion.

27. The method for manufacturing the high voltage MOS-FET according to claim 24, wherein the process forming source/drain areas in the said first and second drift areas, and forming simultaneously body contacts on both sides of the field oxide, further comprises a process forming the first mask layer over the entire surface of the insulation film including the said gate; process etching the said first mask layer in such way that are exposed specified parts of the substrate surface on the left/right of the field oxides formed at both edges of the said first and second drift areas; process ion-injecting high concentration n- or p-type dopants in such exposed parts, and then removing the said first mask layer; process forming the second mask layer on the entire surface of the insulation including the said gate; process etching the said second mask layer in such way that are exposed specified parts of the surfaces of the said first and second drift areas; process ion-injecting high concentration n- or p-type dopants in such exposed parts, and then removing the said second mask layer; and process activating the said ion-injected areas.

28. The method for manufacturing the high voltage MOS-FET according to claim 24, wherein said gate is formed in length of 1.2 $\mu$m to 1.5 $\mu$m.

29. The method for manufacturing the high voltage MOS-FET according to claim 24, wherein to the said metal field plate is applied the gate voltage or a constant voltage separate from the gate voltage.

30. The method for manufacturing the high voltage MOS-FET according to claim 24, wherein said high voltage MOSFET is formed so as to hold the value of breakdown voltage ranging from 20V to 600V.

* * * * *